United States Patent
Kurapov et al.

(10) Patent No.: US 10,378,095 B2
(45) Date of Patent: Aug. 13, 2019

(54) TIB$_2$ LAYERS AND MANUFACTURE THEREOF

(71) Applicant: Oerlikon Surface Solutions AG, Trübbach, Trübbach (CH)

(72) Inventors: Denis Kurapov, Walenstadt (CH); Siegfried Krassnitzer, Feldkirch (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 383 days.

(21) Appl. No.: 14/902,628

(22) PCT Filed: Jun. 30, 2014

(86) PCT No.: PCT/EP2014/001781
§ 371 (c)(1),
(2) Date: Jan. 4, 2016

(87) PCT Pub. No.: WO2015/000576
PCT Pub. Date: Jan. 8, 2015

(65) Prior Publication Data
US 2016/0186306 A1    Jun. 30, 2016

(30) Foreign Application Priority Data

Jul. 3, 2013  (DE) .................... 10 2013 011 075

(51) Int. Cl.
*C23C 14/06* (2006.01)
*C23C 14/34* (2006.01)
*H01J 37/34* (2006.01)

(52) U.S. Cl.
CPC ............ *C23C 14/067* (2013.01); *C23C 14/34* (2013.01); *C23C 14/3464* (2013.01); *H01J 37/3426* (2013.01)

(58) Field of Classification Search
CPC . C23C 14/067; C23C 14/3464; C23C 14/352; C23C 14/34; C23C 14/04; H01J 37/3426; H01J 37/3429
See application file for complete search history.

(56) References Cited

U.S. PATENT DOCUMENTS

| | | |
|---|---|---|
| 4,820,392 A | 4/1989 | Moskowitz et al. |
| 5,851,680 A | 12/1998 | Heau |
| 5,968,596 A | 10/1999 | Ma et al. |

(Continued)

FOREIGN PATENT DOCUMENTS

| | | |
|---|---|---|
| CN | 102439196 A | 5/2012 |
| DE | 19860649 A1 | 7/1999 |

(Continued)

OTHER PUBLICATIONS

Mikula, et al.: "Mechanical Properties of Superhard TiB2 Coatings Prepared by DC Magnetron Sputtering," Vacuum, vol. 82, No. 2; Aug. 17, 2007; pp. 278-281.

(Continued)

*Primary Examiner* — Michael A Band

(57) ABSTRACT

A workpiece having a coating which has at least one TiB$_2$ layer, characterized in that the TiB$_2$ layers have a texture, in the XRD-spectrum, which leads to significant peaks which display a pronounced (002) orientation. The invention also relates to a method for producing said type of workpiece with a coating.

2 Claims, 2 Drawing Sheets

(56) References Cited

U.S. PATENT DOCUMENTS

| | | | |
|---|---|---|---|
| 6,287,711 B1* | 9/2001 | Nieh | B32B 15/04 428/457 |
| 9,376,745 B2* | 6/2016 | Krassnitzer | C23C 14/352 |
| 2003/0039867 A1* | 2/2003 | Berger | C23C 14/067 428/704 |
| 2004/0016640 A1 | 1/2004 | Veerasamy et al. | |

FOREIGN PATENT DOCUMENTS

| | | |
|---|---|---|
| EP | 1184480 A2 | 3/2002 |
| JP | 2002355704 A | 12/2002 |
| JP | 2012139795 A | 7/2012 |
| WO | 2012143087 A1 | 10/2012 |
| WO | 2013060415 A1 | 5/2013 |

OTHER PUBLICATIONS

Kunc, et al.: "Low-Stress Superhard Ti—B Films Prepared by Magnetron Sputtering," Surface & Coatings Technology, vol. 174-175; Apr. 26, 2003; pp. 744-753.

Konca et al.: "Transfer of 319 Al Alloy to Titanium Diboride and Titanium Nitride Based (TiAlN, TiCN, TiN) Coatings Effects of Sliding Speed, Temperature and Environment," Surface & Coatings Technology, vol. 200, No. 7; Nov. 26, 2004; pp. 2260-2270.

Wiedemann et al.: "Structure of Deposited and Annealed TiB2 Layers," Surface & Coatings Technology, vol. 97, No. 1-3; Dec. 1997; pp. 313-321.

Grancic et al.: "The Influence of Deposition Parameters on TiB2 Thin Films Prepared by DC Magnetron Sputtering," Vacuum, vol. 80; 2005; pp. 174-177.

\* cited by examiner

$TIB_2$ LAYERS AND MANUFACTURE THEREOF

FIELD OF THE INVENTION

The present invention relates to a coating that includes at least one $TiB_2$ layer.

BACKGROUND OF THE INVENTION

It is known to use $TiB_2$ as a coating material for tools. For example, U.S. Pat. No. 4,820,392 describes how a sputtering process is used to deposit a layer of $TiB_2$ onto tools. Although the material deposited in this way does feature good mechanical and tribological properties, the industry is seeking ways to achieve a higher density and even greater hardness.

Since $TiB_2$ is a material with a very high melting point, using so-called cathodic arc vaporization, which would result in denser and therefore harder layers, is not economically feasible.

One known option for shifting the density and hardness of sputtered layers into ranges similar to those produced by arc vaporization is the so-called HiPIMS process. (HiPIMS=High Power Impulse Magnetron Sputtering). With this sputtering process, a sputtering cathode is acted on with high power pulse densities, which results in the fact that the material that is vaporized from the cathode has a high percentage of ionization. If a negative voltage is then applied to the work piece that is to be coated, these ions are accelerated toward the work piece, thus producing very dense coatings.

The sputtering cathode must be acted on with power in a pulsed fashion in order to give it time to dissipate the heat input that accompanies the power. In the HiPIMS process, a pulse generator is therefore used as the power source. This pulse generator must be able to output pulses that are very powerful, but very short. The pulse generators available today do not have much flexibility when it comes to pulse height and/or pulse duration, for example. Ideally, rectangular pulse should be output. Usually, though, the power output within a pulse is very time-dependent, which has a direct influence on the layer properties such as hardness, adhesion, internal stress, etc. In addition, the coating rate is negatively influenced by the deviation from the rectangular profile.

In particular, these difficulties raise questions with regard to reproducibility.

SUMMARY OF THE INVENTION

There is thus a need for a method by means of which $TiB_2$ layers can be produced by means of high powered magnetron vaporization.

A method according to the present invention for coating at least one work piece having a layer containing $TiB_2$ can comprise the following steps:
the work piece that is to be coated is placed into a coating chamber; and
the layer containing $TiB_2$ is deposited using a nonreactive sputtering process in an atmosphere containing a working gas by acting on $TiB_2$ targets, characterized in that at least two $TiB_2$ targets are acted on with the power of a DC power source such that occasionally, the power density results in a current density at the targets of locally greater than 0.2 $A/cm^2$, with the targets having to process a power of no greater than 10 kW, averaged over time.

DETAILED DESCRIPTION OF THE PREFERRED EMBODIMENTS

According to the invention, the layers are produced by means of a sputtering process in which a constantly high power output from the power source occurs. A plurality of sputtering cathodes are used for this. Unlike in the conventional HiPIMS process, no pulse generator is used and instead, at first only a first sputtering cathode is acted on with the full power of the power source and thus with a high power density. Then a second sputtering cathode is connected to the outputs of the power source. In this case, not much happens at first because at this point, the impedance of the second sputtering cathode is far higher than the impedance of the first sputtering cathode. Only when the first sputtering cathode is disconnected from the outputs of the power source does the power output occur essentially via the second sputtering cathode. The corresponding high power magnetron sputtering process is described in greater detail in WO 2013060415. Typically, the power source therein is operated at on the order of 60 kW. Typical powers to which the sputtering cathodes are subjected, averaged over time, are on the order of 8 kW.

The inventors have discovered that when such a method is used with ceramic targets such as TiB targets used as sputtering cathodes, it is possible to reproducibly produce layers with very good mechanical properties. The inventors have also discovered that in such a nonreactive process, by adjusting the partial pressure of the working gas, it is possible to influence the layer roughness directly, in fact without this having a significantly negative influence on the above-mentioned mechanical properties.

In the example, $TiB_2$ layers were produced. These layers have a texture and produce significant peaks in the XRD spectrum, which display a pronounced (001)-orientation. Such an orientation turns out to be very advantageous in many applications in which hard material coatings are required.

Figure 1:
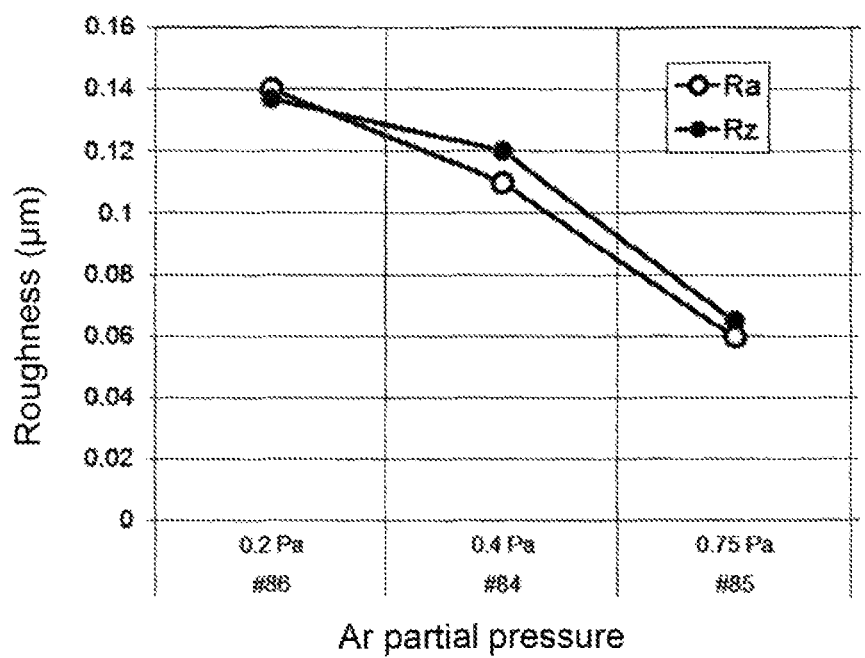
FIG. 1 shows the influence of the partial pressure of the working gas on the roughness of the $TiB_2$ layers in the example.

In order to demonstrate the influence of the partial pressure of the working gas on the roughness, different argon gas flows were used. With an argon gas flow of 80 sccm, roughness values of Ra=0.14 μm and Rz of 0.115 μm were measured; with an argon gas flow of 160 sccm, roughness values of Ra=0.115 μm and Rz of 0.095 μm were measured; and with an argon gas flow of 300 sccm, roughness values of Ra=0.06 μm and Rz of 0.05 μm were measured. In the coating system that was used, an argon flow of 80 sccm corresponded to a partial pressure of 0.2 Pa, an argon flow of 160 sccm corresponded to a partial pressure of 0.4 Pa, and an argon flow of 300 sccm corresponded to a partial pressure of 0.75 Pa. This is shown in FIG. 1.

Figure 2:
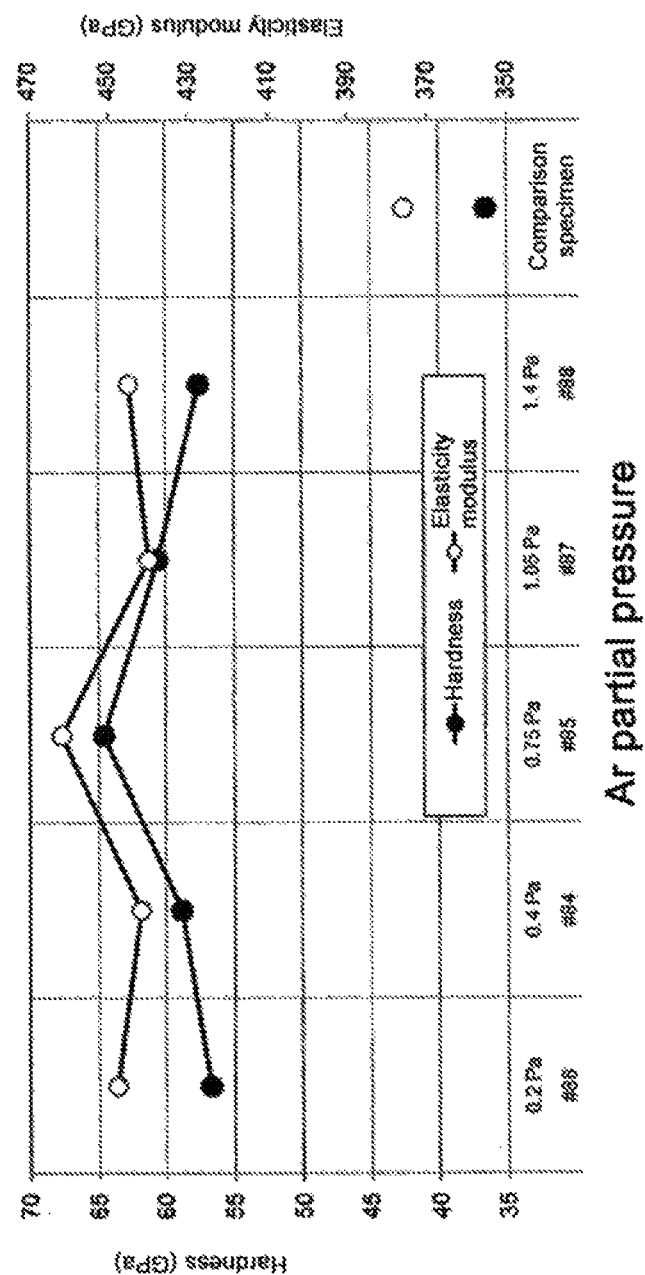
FIG. 2 shows that the hardness of the layers and the elasticity modulus of the layers remained constantly good in the example.

The hardness of the layers and the elasticity modulus of the layers, however, remained constantly good. This is shown in FIG. 2.

The present invention, therefore, has disclosed a method for efficiently and economically producing $TiB_2$ layers. This method yields $TiB_2$ layers with previously unknown hardness combined with very low roughness values. This is of significant interest primarily in connection with applications on sliding, surfaces. The previously conventional PVD vaporization processes did not permit the production of such hard $TiB_2$ layers.

The invention claimed is:

1. A method for coating at least one work piece having a layer containing $TiB_2$ with the following steps:
   placing a work piece that is to be coated into a coating chamber;
   depositing the layer containing $TiB_2$ onto the work piece using a nonreactive high power magnetron sputtering process using no pulse generator in an atmosphere containing a working gas by acting on $TiB_2$ targets, wherein at least two $TiB_2$ targets are acted on with a constantly high power of output of greater than 20 kW from a DC power source, such that a power density results in a current density at each of the at least two $TiB_2$ targets of locally greater than 0.2 $A/cm^2$, with the at least two $TiB_2$ targets processing a power of no greater than 10 kW, averaged over time,
   wherein the nonreactive high power magnetron sputtering process has at first only a first $TiB_2$ target of the at least two $TiB_2$ targets acted on with full power through outputs of the DC power source and thus with a high power density, then a second $TiB_2$ target of the at least two $TiB_2$ targets is connected to outputs of the DC power source, wherein an impedance of the second $TiB_2$ target is higher than an impedance of the first $TiB_2$ target, then the first $TiB_2$ target is disconnected from the outputs of the DC power source, so that power output occurs essentially via the second $TiB_2$ target,
   wherein a roughness of the layer containing $TiB_2$ is influenced by increasing a partial pressure of the working gas to at least 0.2 Pa during the nonreactive high power magnetron sputtering process to decrease the roughness of the layer containing $TiB_2$, and
   wherein the layer containing $TiB_2$ has a texture that produces significant peaks in the XRD spectrum, which display a pronounced (001)-orientation.

2. The method according to claim 1, wherein the working gas contains at least argon.

* * * * *